(12) United States Patent
Goldfarb

(10) Patent No.: US 7,691,550 B2
(45) Date of Patent: Apr. 6, 2010

(54) METHOD FOR MAKING A RELIEF PRINTING FORM

(75) Inventor: Steven Goldfarb, Hockessin, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 548 days.

(21) Appl. No.: 11/820,718

(22) Filed: Jun. 20, 2007

(65) Prior Publication Data

US 2008/0314271 A1    Dec. 25, 2008

(51) Int. Cl.
*G03C 5/00*    (2006.01)
(52) U.S. Cl. .................. 430/30; 430/296; 430/300; 430/306; 430/309; 430/330; 430/942; 430/945
(58) Field of Classification Search .............. 430/30, 430/296, 300, 306, 309, 330, 942, 945
See application file for complete search history.

(56) References Cited

U.S. PATENT DOCUMENTS

| | | | |
|---|---|---|---|
| 4,922,078 A | 5/1990 | Ulrich et al. | |
| 5,262,902 A | 11/1993 | Okumura et al. | |
| 5,386,268 A | 1/1995 | Ohlig et al. | |
| 6,479,217 B1 | 11/2002 | Grinevich et al. | |
| 6,766,740 B1 | 7/2004 | Wier | |
| 6,931,992 B1 | 8/2005 | Hull et al. | |
| 7,049,602 B2 | 5/2006 | Tokhtuev et al. | |

OTHER PUBLICATIONS

CYREL Flexographic Printing Plates and Equipment Manual, by E. I. du Pont de Nemours and Company, pp. 1-23, and 40-43.

*Primary Examiner*—Christopher G Young
(74) *Attorney, Agent, or Firm*—Thomas H. Magee

(57) ABSTRACT

The invention provides a method for making a printing form having a relief surface on a floor from a photosensitive element. The method involves generating a polymerization rate curve for the photosensitive element from a step exposure test by measuring a cure response, such as floor thickness or one or more relief image characteristic/s, of the element relative to an energy density of a source of actinic radiation. The method exposes a photosensitive element to the source of actinic radiation based on energy density that accounts for changes in intensity of lamps used for the source of actinic radiation.

16 Claims, No Drawings

METHOD FOR MAKING A RELIEF PRINTING FORM

BACKGROUND OF THE INVENTION

1. Field of the Disclosure

This invention pertains to a method for making a printing form having a relief surface, and in particular to a method for making a printing form from a photopolymerizable printing element.

2. Description of Related Art

Flexographic printing forms, such as printing plates, plates-on-sleeves, and printing cylinders, are widely used for printing of packaging materials ranging from corrugated carton boxes to cardboard boxes and to continuous web of plastic films. Flexographic printing forms are used in relief printing in which ink is carried from a raised-image surface and transferred to a substrate. Flexographic printing forms can be prepared from photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a solid layer of the photopolymerizable composition interposed between a support and a coversheet or a multilayer cover element. Flexographic printing forms are characterized by their ability to crosslink or cure upon exposure to actinic radiation. Typically, the printing form is uniformly exposed through its backside, i.e., backflashed, to a specified amount of actinic radiation to form a floor. Next, the form is imagewise exposed through its front side with the same actinic radiation that was used for the backflash exposure. The imagewise exposure is made through an image-bearing art-work or a template, such as a photographic negative or transparency (e.g. silver halide films), or through an in-situ mask having radiation opaque areas that had been previously formed above the photopolymerizable layer. The actinic radiation exposures can be conducted with ultraviolet (UV) or black light. The actinic radiation enters the photosensitive element through the clear areas and is blocked from entering the black or opaque areas of the transparency or in-situ mask. The areas of the photopolymerizable layer that were exposed to the actinic radiation crosslink and harden and/or become insoluble to solvents used during development. The unexposed areas of the photopolymerizable layer that were under the opaque regions of the transparency or in-situ mask during exposure do not hardened and/or remain soluble. The unexposed areas are removed by treating with washout solutions or heat leaving a relief image suitable for printing. If treated with washout solutions, the form is dried. The printing form can be further exposed to complete polymerization, i.e. post-exposure, and to remove surface tackiness, i.e., finishing exposure. After all desired processing steps, the form is then mounted on a cylinder and used for printing.

The three exposure steps, i.e., backflash, imagewise exposure, and post-exposure, can be accomplished using actinic radiation from a variety of actinic radiation sources, such as for example, lamps. Most often the printing form is exposed to a bank of lamps in an exposure unit based upon a pre-determined length of time, i.e., exposure interval. Exposure times vary from a few seconds to a few minutes depending upon the output of the lamps, distance from the lamps, desired relief depth, and the thickness of the plate. The predetermined exposure time can be derived from a test on a representative sample of the printing form at the same or similar conditions used ordinarily to prepare the printing form. The test involves exposing the sample to a series of different times, treating the sample to remove unpolymerized material, and analyzing the resulting sample. The test may be referred to as a backflash test or a main exposure test. In the backflash test, the sample is exposed through the support, and the resulting sample is measured for thickness of the floor. The time providing the desired floor thickness is the pre-determined time for the back exposure. In the main exposure test, the sample is exposed through a test target image (i.e., phototool or in-situ mask layer), and the resulting sample is analyzed for relief image quality, e.g., relief structure holds fine lines and highlight dot areas, and adequate depth in reverse images. The time providing the desired relief image is the pre-determined time for the main exposure.

However it may be necessary to frequently recalibrate the predetermined exposure time/s for consistent results. Time of exposure can be influenced by the lamp intensity, spectral energy distribution of the radiation emitted from the source, the distance from the photosensitive element, the desired image resolution, and the nature and amount of the photopolymerizable composition in the element. Lamp intensity diminishes with use, and the predetermined exposure time that was used to prepare the printing form becomes inadequate to cure or crosslink subsequent printing forms. Even when the lamp or lamps are replaced, the light intensity drops off in the first 20 hours of lamp life, so that recalibration is necessary throughout this initial age-in of the lamps. Factors which affect the replacement of lamps are the physical location of the lamps within the hood, their elapsed operation time, and the elapsed operation time of all adjacent lamps. Frequent recalibration is an is undesired step that can consume considerable platemaking time and manpower, as well as printing forms.

Exposure units are known to have a radiation integration system, sometimes referred to as an integrator, which evaluates the intensity of the lamps illuminating the bed where the printing form lies. An example of an exposure unit having an integrator is the CYREL®4260ECLF. The integration system compensates the time of exposure according to the intensity of the radiation emitted by the lamps. The system may include a photocell that senses the radiation incident thereon, and a circuit that integrates a signal from the photocell. The photocell in these exposure units typically measures the intensity of the lamps for a broad spectrum of wavelengths of the emitted radiation. The circuit integrates the photocell signal until a predetermined circuit output signal is achieved which corresponds to a particular exposure value. Such exposure control systems, should in theory provide the designed for exposure values. In practice however, since exposure is a function of many variable factors, there is potential for the exposure values actually produced by any such system to vary from the values designed for. These variations in exposure values often result from the cumulative effect of variations, typically within prescribed tolerances, of the optical, electronic, etc. systems.

Thus, it is desirable to insure proper exposure of photosensitive elements consistently over the useful life of the lamp/s in an exposure unit. It is also desirable to avoid the time, manpower, and materials associated with recalibration of lamps to determine appropriate time interval of exposure for photosensitive elements. It is also desirable to insure proper exposure of photosensitive elements necessary to achieve satisfactory resulting relief structures for printing forms

SUMMARY OF THE INVENTION

The present invention provides a method for making a printing form having a desired cure response, Rc, comprising:

a) providing a photosensitive element having a layer of a photopolymerizable composition comprising an elastomeric binder, a monomer, and a photoinitiator having an absorption spectrum capable of activation by actinic radiation;
b) providing a source of the actinic radiation having an emission spectra and a peak emission;
c) measuring intensity of the source using a sensor having an absorption peak matched to the peak emission of the source of actinic radiation;
d) conducting a step exposure test comprising:
   1) exposing the photosensitive element to the source of actinic radiation at times T1 and T2;
   2) treating to form polymerized portions having a cure response Rc1 and Rc2 corresponding to times T1 and T2 respectively; and
   3) measuring the cure responses Rc1 and Rc2;
e) creating a polymerization rate curve for the photosensitive element of the cure response versus energy density that is determined by the intensity of step c) multiplied by the times T1 and T2;
f) providing a second photosensitive element having a layer of the composition comprising the elastomeric binder, the monomer, and the photoinitiator; and
g) exposing the second element to the source of the actinic radiation based on an energy density determined from the polymerization rate curve generated in step e) to form polymerized portions having the desired cure response Rc.

DESCRIPTION OF THE PREFERRED EMBODIMENT(S)

The present invention provides a method for making a printing form, in particular a flexographic relief printing form, from a photosensitive element having a layer of a photopolymerizable composition that includes a photoinitiator. The method involves generating a polymerization rate curve for the photosensitive element from a step exposure test by measuring a cure response, such as floor thickness, or relief image characteristic/s, of the element relative to an energy density (or Exposure) of a source of actinic radiation. The energy density is determined by measuring intensity of the source of actinic radiation using a sensor having an absorption sensitivity matched to an emission sensitivity of the source of actinic radiation, factored with exposure times used in the step exposure test. The photosensitive element is exposed to the source of actinic radiation based on an energy density from the polymerization rate curve that provides the desired cure response.

The present method provides an easy and economical way to control and enhance the quality of the resulting relief image of a printing form in flexographic printing processes. The method exposes the photosensitive element to the source of actinic radiation based on energy density which accounts for changes in intensity of lamps used for the source of actinic radiation. The method insures proper exposure of photosensitive elements consistently over the useful life of lamp/s in an exposure unit. The method also avoids exposing the photosensitive element based on a pre-determined time interval, and thereby avoids recalibration of lamp/s to determine appropriate time interval of exposure as the intensity of the lamps diminish with use.

"Actinic radiation" refers to radiation capable of initiating reaction or reactions to change the physical or chemical characteristics of a photosensitive composition. In one embodiment, actinic radiation refers to radiation having wavelengths in the ultraviolet region. In another embodiment, actinic radiation refers to radiation having wavelengths in the visible region. In another embodiment, actinic radiation refers to radiation having wavelengths in the ultraviolet and visible regions.

"Absorption peak" or "peak activating radiation" refers to a wavelength or frequency at which a material absorbs the most power whenever the material is bombarded with light waves. "Absorption spectrum" refers to an array of absorption lines and absorption bands that results from the passage of radiant energy from a continuous source through a absorbing medium.

"Emission peak" or "peak emission" refers to a wavelength or frequency at which a source of radiation emits the most power.

"Emission spectrum" refers to electromagnetic spectrum produced when radiations from any emitting source, excited by any of various forms of energy are dispersed.

Step a) of the present process is to provide a photosensitive element. In one embodiment, the photosensitive element is a photopolymerizable element suitable for use as a relief printing form. In another embodiment, the relief printing form is suitable for use in flexographic printing processes. Unless otherwise indicated, the term "photosensitive element or form" encompasses elements in any form that can be prepared suitable for flexographic printing, including, but not limited to, flat sheets, plates-on-sleeves, seamed continuous forms, and seamless continuous forms. The photosensitive element includes a layer of a photopolymerizable composition comprising an elastomeric binder, a monomer, and a photoinitiator. The photoinitiator is capable of activation by actinic radiation, having sensitivity to the radiation in accordance with its absorption spectrum. The absorption spectrum of the photoinitiator includes an absorption peak at a wavelength within an emission spectrum of the actinic radiation.

Step b) of the present method is providing a source of actinic radiation having an emission spectrum with a peak emission. The source of actinic radiation may have more than one peak emission at different wavelengths. The peak emission of the radiation source that is of most interest is the peak wavelength that is associated with activation of the photoinitiator. The emission spectrum of the radiation source overlaps with the absorption spectrum of the photoinitiator. Actinic radiation from any source and of any type can be used in the present method. Typically, the source of actinic radiation is provided in an exposure unit. Exposure units are commercially available from various manufacturers or suppliers including DuPont, Anderson & Vreeland, and Flint Group. The radiation can emanate from multiple lamps or from point sources to provide a uniform or substantially uniform exposure to the entire photosensitive material when in position in the exposure unit. The radiation can emanate in the form of parallel rays or divergent beams. Most photosensitive elements absorb in the region of 310 to 400 nm, and radiation sources that emit in this region are well known. The preferred photosensitivity of most common photosensitive elements for use as printing forms are in the UV and deep UV area of the spectrum, as they afford better room-light stability. Examples of suitable visible and UV sources of actinic radiation include carbon arcs, mercury-vapor arcs, argon-glow lamps, fluorescent lamps and tubes, pulsed xenon lamps, electron flash units, electron beam units, and photographic flood lamps. In one embodiment, a suitable source of UV radiation is a bank of multiple mercury vapor lamps. Examples of industry standard radiation sources include Sylvania 350 Blacklight fluorescent lamp and Philips UV-A "TL"-series low-pressure mercury-vapor fluorescent lamps. The source of radiation can also include high-intensity lamps, such as for example, medium pressure mercury arc lamps, and mercury arc metal halide lamps which are doped with additives (to increase the intensity of energy emitted in a particular wavelength region). The radiation source can be located at a distance of about 4 to 180 cm, and are typically 5 to 160 cm, from a surface of the photosensitive element. In one embodiment the source of actinic radiation has an emission spectra in the region of 310 to 400 nm and a peak emission at about 370 nm. In another embodiment the source of actinic radiation has an emission spectra in the region of 310 to 400 nm and a peak emission at about 365 nm. In yet another embodiment, the source of actinic radiation has an emission spectra in the region of 310 to 400 nm and a peak emission at about 360 nm. In yet another embodiment, the source of actinic radiation has an emission spectra in the region of 310 to 400 nm and a peak emission at about 355 nm. In one embodiment the source of actinic radiation has an emission spectra in the region of 200 to 310 nm and a peak emission at about 255 nm.

The suitability of a particular actinic radiation source is governed by the photosensitivity of at least the photoinitiator, and optionally the at least one monomer used in preparing the printing form from the photosensitive element. The source of actinic radiation has an emission spectrum that should furnish an effective amount of radiation at the wavelength range at which the photosensitive system, i.e., photoinitiator and/or monomer, exhibits its sensitivity. As such the emission spectrum of the source of actinic radiation overlaps with the absorption spectrum of the photoinitiator. For example, many photosensitive systems exhibit their maximum sensitivity in the ultraviolet range, the radiation source should furnish an effective amount of radiation having a wavelength range between about 310 and 400 nm. In one embodiment, the emission spectrum of the actinic radiation source entirely overlaps with the absorption spectrum of the photoinitiator. In another embodiment, the emission spectrum of the actinic radiation source partially overlaps with the absorption spectrum of the photoinitiator. In another embodiment, the emission spectrum of the actinic radiation source partially overlaps with the absorption spectrum of the photoinitiator, but at least overlaps at the peak absorption by the photoinitiator.

Step c) of the present method is measuring intensity of the source of actinic radiation using a sensor having an absorption peak matched to the peak emission of the source of actinic radiation. The source of actinic radiation has an intensity that is measured at a location where the photosensitive element resides for exposing, such as, at a plane on the plate bed in the exposure unit. The intensity of the radiation source is measured using a sensor having an absorption peak that is matched to a peak emission of the source of actinic radiation. The absorption peak of the sensor may also be referred to as a peak sensitivity or peak sensitivity wavelength. The term "matched" in this context means that the peak sensitivity of the sensor is within 25 nm wavelengths of a peak emission of the source of actinic radiation. In one embodiment, the sensor measures the intensity at a peak sensitivity wavelength that is the same as the wavelength of maximum emission of the source of actinic radiation, i.e., at peak emission. In another embodiment, the sensor measures the intensity at a peak sensitivity wavelength that is within ±20 nanometers (peak-to-peak) of the wavelength of maximum emission of the source of actinic radiation. In another embodiment, the sensor measures the intensity at a peak sensitivity wavelength that is within ±10 nanometers (peak-to-peak) of the wavelength of maximum emission of the source of actinic radiation. In another embodiment, the sensor measures the intensity at a peak sensitivity wavelength of maximum absorption that is within ±5 nanometers (peak-to-peak) of the wavelength of maximum emission of the source of actinic radiation. Suitable sensors for detecting UV radiation, may also be referred to as photodiodes, are available from Hamamatsu (New Jersey), Roitherner Laser Technik GmbH (Austria), and Electro Optical Components (California). A suitable sensor is GaAsP photodiode Model No. G5842 from Hamamatsu, (Bridgewater, N.J.), that has a peak sensitivity at 370 nm. The sensor is connected to a readout device which receives a signal from the sensor and displays the intensity of the radiation source. A suitable readout device is a handheld digital radiometer Model 5.0 from SolarTech Inc. (Harrison Township, Mich.). The intensity of the source of radiation can be measured at one or more locations in the plane of the bed, and the multiple readings averaged. The intensity is measured by placing the sensor on the bed (where a photosensitive element would reside), activating the source of actinic radiation to illuminate the exposure bed, and the intensity of the radiation source is read from the radiometer that was connected to the sensor. The intensity measurement (and subsequent exposure steps) can be conducted at ambient conditions.

Optionally prior to measuring its intensity, the source of actinic radiation may be warmed. Warming the source of actinic radiation can improve the consistency of the process. In one embodiment the source of radiation is warmed by energizing the source in the exposure unit for a period of time, such as 5 to 30 minutes, prior to measuring the intensity (and conducting step exposure test). The actinic radiation source can be warmed to a temperature of about 200 to about 35° C. In another embodiment, the source of radiation is actively warmed with a heater for example, as disclosed by Ulrich et al. in U.S. Pat. No. 4,922,078, prior to measuring the intensity. The intensity of the source of actinic radiation may also be called irradiance, and generally is expressed in terms of power per unit area, such as milliJoules/cm$^2$-second or milliWatts/cm$^2$.

Step d) of the present method is conducting a step exposure test. A step exposure test is conducted on a representative sample of the photosensitive element that will be used as a printing form. The representative sample of the photosensitive element is not limited, and can be a full-sized photosensitive element that could be used as a printing form, or a portion of the photosensitive element sized sufficiently to conduct the step exposure series. It is also possible to use a separate representative sample for each exposure time for the step exposure series. The step exposure test is one in which the sample is successively exposed to the source of actinic radiation, in the same fashion, for at least 2 or more intervals of time. In one embodiment, only 2 intervals of time are used in the step exposure test. In another embodiment, 4 to 8 intervals of time are used. In another embodiment, 6 to 10 intervals of time are used. The step exposure test can be a blanket exposure or an imagewise exposure through an image or a test target. A test target typically includes repeated images representing an expected full range of print image characteristics, such as 1 to 99% halftone dots, and positive and negative lines, for evaluating the printing capability and quality of the image of the printing form. For photosensitive elements for use as flexographic printing forms, the test target includes repeated images that will form repeated relief images in the printing form upon exposure and treatment. The test target can be a phototool or formed on the surface of the sample (opposite the support) as an intimate in-situ mask. The length of time for each interval is generally the same, for example, 30 second increments results in the sample being exposed for at least 0, 30, and 60 seconds. The range of exposure times used for the step exposure test should be representative of the range of possible suitable exposure conditions useful for the photosensitive element. For the step exposure test, the sample is marked off in approximately equal portions; the sample appropriately oriented on the bed of the exposure unit; an opaque material, such as a cardboard sheet, is positioned adjacent the sample covering one of the portions to prevent the radiation from exposing the sample; and the sample is exposed to the source of actinic radiation. After each increment of time, the opaque material is moved across the sample to each marked portion successively blocking more of the sample and limiting the exposure time for each portion. After the series of exposures, the unpolymerized material is removed by treating the sample using (1) "wet" development wherein the photopolymerizable layer is contacted with a suitable developer solution to washout unpolymerized areas and (2) "dry" development wherein the photosensitive element is heated to a development temperature which causes the unpolymerized areas of the photopolymerizable layer to melt or soften or flow and is removed by contact with an absorbent material. Typically the sample is treated in the same manner that the photosensitive element will ultimately be treated to remove the unpolymerized material. The treated sample will have polymerized or cured portions, that will represent the cure response of the photosensitive element at each of the at least 2 time intervals. The cure responses of each of the at least 2 time intervals are measured.

In one embodiment, the step exposure test is conducted by blanket exposing the sample through the back, i.e., through the support, at different time intervals, to polymerize or cure the sample in depth. In this embodiment, the cure response is the depth of cure, or the height of the floor created at each time interval, which is then measured. The process of preparing a printing form from a photosensitive element usually includes a back exposure or backflash step. This is a blanket exposure to actinic radiation through the support. It is used to create a layer of polymerized material, or a floor, on the support side of the photopolymerizable layer and to sensitize the photopolymerizable layer. The floor provides improved adhesion between the photopolymerizable layer and the support, helps highlight dot resolution and also establishes the depth of the plate relief. In the preparation of a flexographic printing form from a photosensitive element the backflash exposure can take place before, after or during the other imaging steps.

In another embodiment, the step exposure test is conducted by imagewise exposing the sample through a mask adjacent the front, i.e., the side of photopolymerizable layer opposite the support, at different time intervals, to imagewise polymerize or cure the sample. In this embodiment, the sample may already have been blanket exposed to the desired depth to form the floor. In this embodiment, the cure response is one or more of the relief image characteristics, such as degree of holding fine highlight dots or fine lines, for evaluating the quality of the image. It is well within the ordinary skill of those in the art to identify other critical characteristics for evaluating relief image quality relative to the cure response of the photosensitive element. The process of preparing a printing form from a photosensitive element includes an overall (or main) exposure of the photosensitive element to the actinic radiation through a mask, which can be a phototool or an in-situ mask. The mask includes opaque areas and "clear" areas that form the image. The opaque areas of the mask prevent the photopolymerizable material beneath from being exposed to the radiation and hence those areas of the photopolymerizable layer covered by the dark areas do not polymerize. The "clear" areas of the mask expose the photopolymerizable layer to actinic radiation and polymerize or crosslink.

In step e) a polymerization rate curve for the photosensitive element is created of the measured cure response versus an energy density. Energy density is determined by the intensity of the source of actinic radiation as measured in step c) multiplied by the time used in the step exposure test of step d) 1). The measured cure response at each time, such as floor height or degree of holding highlight dots (image characteristic for imagewise exposure), are plotted against the corresponding energy density, and a best fit line between the coordinates is drawn. The polymerization rate curve is unique to a particular photopolymerizable composition associated with the representative sample (and the photosensitive element for use as the printing form). The polymerization rate curve can be created manually or by readily available computer software. In general, the polymerization rate curve is linear, but is not so limited. The energy density may also be referred to as Exposure, and is expressed in milliJoule/cm$^2$ or milliWatt/second-cm$^2$.

Step f) of the present method provides a second photosensitive element which is at least substantially the same as the representative sample. A printing form is prepared from a photosensitive element that is the same as the representative sample used for the step exposure test. The photosensitive element for the printing form, i.e., a second photosensitive element, is the same as the representative sample if they both have at least the same or substantially the same photopolymerizable composition. The second photosensitive element is substantially the same as the representative sample when the second photosensitive element includes in the photopolymerizable composition at least the same elastomeric binder, the monomer, and the photoinitiator as that of the representative sample; and is the same as the representative sample when all components in the photopolymerizable composition are the same as that of the representative sample. In one embodiment, in addition to the photopolymerizable composition being the same, the structure of the photosensitive element for use as the printing form will be the same as the structure for the representative sample. The structure of the photosensitive element refers to the presence or absence of certain additional optional layers and the position of the additional layers relative to the photopolymerizable layer. In another embodiment, in addition to the photopolymerizable composition being the same, the thickness of the photopolymerizable layer for the photosensitive element for use as the printing form will be the same or substantially the same as the thickness of the photopolymerizable layer of the representative sample. A printing form is prepared from the second photosensitive element in a conventional fashion, except that the exposure to actinic radiation used for at least one of the exposure steps, i.e., backflash and imagewise exposure, is based on an energy density instead of time. From the polymerization rate curve generated in step e), an energy density necessary to expose the second photosensitive element is selected based on a desired cure response, Rc, such as floor thickness or (relief) image characteristic, for the resulting printing form. In step g) exposure of the photosensitive element to the source of actinic radiation based on the energy density forms polymerized portion having the desired cure response, Rc. Exposure based on energy density ensures proper exposure of the photosensitive element in that a constant amount of actinic radiation is used to cure the photosensitive element and subsequently prepared photosensitive elements, compensating for diminishing intensity of the actinic radiation source with use. The time for the exposure by the source of actinic radiation will likely not remain constant over extended periods of use of the exposure unit, but the energy density will remain constant or substantially constant. At least the same sensor that was used in step c) is placed adjacent to the second photosensitive element and connected to the readout device to determine the energy density impinging the photosensitive element during exposure.

Steps a) through f) of the present method need only be conducted once for a particular photosensitive element having substantially the same layer of photopolymerizable composition as the representative sample. The second photosensitive element and all subsequent photosensitive elements that are prepared into printing forms can use the generated polymerization rate curve to determine the energy density necessary for exposing based on the desired cure response, Rc. In one embodiment, the backflash exposure to actinic radiation is based upon energy density. In one embodiment, the main (imagewise) exposure to actinic radiation is based upon energy density. In one embodiment, the post-exposure to actinic radiation is based upon energy density. In one embodiment, the detackification to actinic radiation is based upon exposure density. In another embodiment, both the backflash and the main exposures are based on the energy density suitable to provide the desired cure response. In one embodiment, the photosensitive element is given the backflash exposure based upon the energy density for the desired cure response Rc of the floor height. In another embodiment, the photosensitive element is given the imagewise exposure based upon the energy density for the desired cure response Rc of the relief image characteristics. In another embodiment, the photosensitive element is given both the backflash and the imagewise exposures based upon the appropriate energy density for the particular exposure and desired cured response Rc. It is also contemplated and within the scope of the present invention that the present method, particularly steps a) through f) can be used to determine the energy density necessary for post-exposure (to complete polymerization process after treating), as well as for a detackification exposure (to eliminate tackiness of the surface of the printing form after treating). In the embodiment for determining the energy density for the detackification step, a sensor having peak sensitivity at 254 nm would be used to match the peak emission of the source of radiation for detackification.

Photosensitive Element

The photosensitive element includes a layer of a photopolymerizable composition comprising an elastomeric binder, at least one monomer, and a photoinitiator. As used herein, the term "photopolymerizable" is intended to encompass systems that are photopolymerizable, photocrosslinkable, or both. The photoinitiator has sensitivity to actinic radiation.

The binder can be a single polymer or mixture of polymers. Binders include natural or synthetic polymers of conjugated diolefin hydrocarbons, including polyisoprene, 1,2-polybutadiene, 1,4-polybutadiene, and butadiene/acrylonitrile. Preferably, the thermoplastic binder is an elastomeric block copolymer of an A-B-A type block copolymer, where A represents a non-elastomeric block, preferably a vinyl polymer and most preferably polystyrene, and B represents an elastomeric block, preferably polybutadiene or polyisoprene. Suitable thermoplastic elastomeric binders of this type include poly(styrene/isoprene/styrene) block copolymers and poly(styrene/butadiene/styrene) block copolymers which are preferred. The non-elastomer to elastomer ratio is preferably in the range of from 10:90 to 35:65. The binder is present in an amount of at least 50% by weight of the photopolymerizable layer.

The term binder, as used herein, encompasses core shell microgels and blends of microgels and preformed macromolecular polymers, such as those disclosed in Fryd et al., U.S. Pat. No. 4,956,252 and Quinn et al., U.S. Pat. No. 5,707,773.

Other suitable photosensitive elastomers that may be used include polyurethane elastomers. An example of a suitable polyurethane elastomer is the reaction product of (i) an organic diisocyanate, (ii) at least one chain extending agent having at least two free hydrogen groups capable of polymerizing with isocyanate groups and having at least one ethylenically unsaturated addition polymerizable group per molecule, and (iii) an organic polyol with a minimum molecular weight of 500 and at least two free hydrogen containing groups capable of polymerizing with isocyanate groups. For a more complete description of some of these materials see U.S. Pat. No. 5,015,556.

The photopolymerizable composition contains at least one compound capable of addition polymerization that is compatible with the binder to the extent that a clear, non-cloudy photosensitive layer is produced. The at least one compound capable of addition polymerization may also be referred to as a monomer and can be a single monomer or mixture of monomers. Monomers that can be used in the photopolymerizable composition are well known in the art and include, but are not limited to, addition-polymerization ethylenically unsaturated compounds with at least one terminal ethylenic group. Examples of suitable monomers include, but are not limited to, acrylate and methacrylate mono-esters of alcohols and polyols, and acrylate and methacrylate poly-esters of alcohols and polyols. Examples of alcohols and polyols include alkanols; alkylene glycols; trimethylol propane; pentaerythritol; dipentaerythritol; polyacrylol oligomers, and the like. A mixture of monofunctional and multifunctional acrylates or methacrylates may be used. Other examples of suitable monomers include acrylate and methacrylate derivatives of isocyanates, esters, epoxides and the like. Monomers can be appropriately selected by one skilled in the art to provide elastomeric property to the photopolymerizable composition. Examples of elastomeric monomers include, but are not limited to, acrylated liquid polyisoprenes, acrylated liquid butadienes, liquid polyisoprenes with high vinyl content, and liquid polybutadienes with high vinyl content, (that is, content of 1-2 vinyl groups is greater than 20% by weight). Further examples of monomers can be found in Chen U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315. The compound capable of addition polymerization (monomer) is present in at least an amount of 5%, preferably 10 to 20%, by weight of the elastomeric composition.

The photoinitiator can be any single compound or combination of compounds which is sensitive to actinic radiation, generating free radicals which initiate the polymerization of the monomer or monomers without excessive termination. The photoinitiator is activated by the actinic radiation, having sensitivity to the radiation in accordance with its absorption spectrum. The absorption spectrum of the photoinitiator typically includes an absorption peak at a wavelength of maximum absorption to the actinic radiation. Photosensitive elements for use as flexographic printing forms that are sensitive to these particular UV sources typically use photoinitiators that absorb between 310-400 nm. Any of the known classes of photoinitiators, particularly free radical photoinitiators such as quinones, benzophenones, benzoin ethers, aryl ketones, peroxides, biimidazoles, benzyl dimethyl ketal, hydroxyl alkyl phenyl acetophone, dialkoxy actophenone, trimethylbenzoyl phosphine oxide derivatives, aminoketones, benzoyl cyclohexanol, methyl thio phenyl morpholino ketones, morpholino phenyl amino ketones, alpha halogennoacetophenones, oxysulfonyl ketones, sulfonyl ketones, oxysulfonyl ketones, sulfonyl ketones, benzoyl oxime esters, thioxanthrones, camphorquinones, ketocouumarins, Michler's ketone may be used. Alternatively, the photoinitiator may be a mixture of compounds, one of which provides the free radicals when caused to do so by a sensitizer activated by radiation. In one embodiment, the initiator is sensitive to ultraviolet radiation. In another embodiment, the initiator is sensitive to visible radiation. Photoinitiators are generally present in amounts from 0.001% to 10.0% based on the weight of the photopolymerizable composition.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, and fillers.

The thickness of the photopolymerizable layer can vary over a wide range depending upon the type of printing plate desired, for example, from about 0.020 inches to about 0.250 inches or greater (about 0.05 cm to about 0.64 cm or greater).

The photosensitive element typically includes a support adjacent the at least one photopolymerizable layer. The support can be any flexible material that is conventionally used with photosensitive elements used to prepare flexographic printing plates. In one embodiment, the support is transparent to actinic radiation to accommodate "backflash" exposure through the support. Examples of suitable support materials include polymeric films such those formed by addition polymers and linear condensation polymers, transparent foams and fabrics. Under certain end-use conditions, metals such as aluminum, may also be used as a support, even though a metal support is not transparent to radiation. A preferred support is a polyester film; particularly preferred is polyethylene terephthalate. The support may be in sheet form or in cylindrical form, such as a sleeve. The sleeve may be formed from single layer or multiple layers of flexible material. The sleeve may also be made of non-transparent, actinic radiation blocking materials, such as nickel or glass epoxy. The support typically has a thickness from 0.002 to 0.050 inch (0.0051 to 0.127 cm). A preferred thickness for the sheet form is 0.003 to 0.016 inch (0.0076 to 0.040 cm). The sleeve has a wall thickness that can vary over a wide range depending upon the type of printing form desired, for example, from about 0.002 inch to about 1 inch or greater (0.005 to 2.54 cm or greater).

The photopolymerizable layer itself can be prepared in many ways by admixing the binder, monomer, photoinitiator, and other ingredients. It is preferred that the photopolymerizable mixture be formed into a hot melt and then calendered to the desired thickness. An extruder can be used to perform the functions of melting, mixing, deaerating and filtering the composition. The extruded mixture is then calendered between the support and a temporary coversheet. Alternatively, the photopolymerizable material can be placed between the support and the temporary coversheet in a mold. The layers of material are then pressed flat by the application of heat and/or pressure. Preparation of cylindrical seamless photopolymerizable elements is not limited, and may be prepared for example according to the method and apparatus disclosed by Cushner et al. in U.S. Pat. No. 5,798,019.

The photosensitive element includes at least one photopolymerizable layer that can be of a bi- or multi-layer construction. Further, the photosensitive element may include an elastomeric capping layer on the at least one photopolymerizable layer. A second polymeric binder and a nonmigratory dye or pigment can optionally be present in the elastomeric capping layer. The elastomeric composition can also contain a monomer or monomers and a photoinitiating system. The elastomeric polymeric binder in the elastomeric composition is generally the same as or similar to the elastomeric binder present in the photopolymerizable layer. The elastomeric capping layer is typically part of a multilayer cover element that becomes part of the photosensitive printing element during calendering of the photopolymerizable layer. The thickness of the elastomeric capping layer is typically 1.5 to 3.0 mils (38.1 to 76.2 micron), preferably 1.8 to 2.8 mils (45.7 to 71.1 micron). Such multilayer cover elements and compositions suitable as the elastomeric capping layer are disclosed in Gruetzmacher et al., U.S. Pat. No. 4,427,759 and U.S. Pat. No. 4,460,675. Although the elastomeric capping layer may not necessarily contain photoreactive components, the layer ultimately becomes photosensitive when in contact with the photopolymerizable layer. As such, upon imagewise exposure to actinic radiation, the elastomeric capping layer has portions in which polymerization or crosslinking have occurred and portions which remain unpolymerized, i.e., uncrosslinked. Treating causes the unpolymerized portions of the elastomeric capping layer to be removed along with the photopolymerizable layer in order to form the relief surface. The elastomeric capping layer that has been exposed to actinic radiation remains on the surface of the polymerized areas of the photopolymerizable layer and becomes the actual printing surface of the printing plate.

The present photosensitive printing element may further comprise one or more additional layers on the at least one photopolymerizable layer. Additional layers on the photopolymerizable layer include release layer, an actinic radiation opaque layer, a barrier layer, and a layer which alters the surface characteristics of the photosensitive element. One additional layer may provide multiple functions for the photosensitive element. One or more of the additional layers can cover the photopolymerizable layer. If the actinic radiation opaque layer is present, at least one barrier layer may be interposed between the photopolymerizable layer and the radiation opaque layer. If present, the barrier layer minimizes migration of materials between the photopolymerizable layer and the radiation opaque layer. Monomers and plasticizers can migrate over time if they are compatible with the materials in an adjacent layer. Such migration can occur, for example, from the photopolymerizable layer into the radiation opaque layer. In such instances, the infrared sensitivity of the radiation opaque layer may be altered. In addition, such migration can cause smearing and tackifying of the radiation opaque layer after imaging.

Since the surface of the photopolymerizable layer may be tacky, a release layer having a substantially non-tacky surface can be applied to the surface of the photopolymerizable layer. Such release layer can protect the surface of the photopolymerizable layer from being damaged during removal of an optional temporary coversheet and can ensure that the photopolymerizable layer does not stick to the coversheet. During image exposure, the release layer can prevent the image-bearing mask from binding with the photopolymerizable layer. The release layer is insensitive to actinic radiation. The release layer is also suitable as a first embodiment of the barrier layer which is optionally interposed between the photopolymerizable layer and the actinic radiation opaque layer. The elastomeric capping layer may also function as a second embodiment of the barrier layer. Examples of suitable materials for the release layer are well known in the art, and include polyamides, polyvinyl alcohol, hydroxyalkyl cellulose, copolymers of ethylene and vinyl acetate, amphoteric interpolymers, and combinations thereof.

The photosensitive printing element may further include the actinic radiation opaque layer disposed above a surface of the photopolymerizable layer opposite the support. The actinic radiation opaque layer may substantially cover the surface or only cover an imageable portion of the photopolymerizable layer. The actinic radiation opaque layer is substantially opaque to actinic radiation and preferably is sensitive to infrared radiation. The actinic radiation opaque layer can be used with or without the barrier layer. If used with the barrier layer, the barrier layer is disposed between the photopolymerizable layer and the radiation opaque layer. The actinic radiation opaque layer comprises a radiation-opaque material, an infrared-absorbing material, and an optional binder. Dark inorganic pigments, such as carbon black and graphite, mixtures of pigments, metals, and metal alloys generally function as both infrared-sensitive material and radiation-opaque material. The optional binder is a polymeric material which includes, but is not limited to, self-oxidizing polymers, non-self-oxidizing polymers, thermochemically decomposable polymers, polymers and copolymers of butadiene and isoprene with styrene and/or olefins, pyrolyzable polymers, amphoteric interpolymers, polyethylene wax, materials conventionally used as the release layer described above, and combinations thereof. The thickness of the infrared-sensitive layer should be in a range to optimize both sensitivity and opacity, which is generally from about 20 Angstroms to about 50 micrometers. The actinic radiation opaque layer should have a transmission optical density of greater than 2.0 in order to effectively block actinic radiation and the polymerization of the underlying photopolymerizable layer.

The actinic radiation opaque layer is employed in digital direct-to-plate image technology in which laser radiation, typically infrared laser radiation, is used to form a mask of the image for the photosensitive element (instead of the conventional image transparency or phototool). Digital methods create a mask image in situ on or disposed above the photopolymerizable layer with laser radiation. Digital methods of creating the mask image require one or more steps to prepare the photosensitive element prior to imagewise exposure. Generally, digital methods of in-situ mask formation either selectively remove or transfer the radiation opaque layer, from or to a surface of the photosensitive element opposite the support. The method by which the mask is formed with the radiation opaque layer on the photosensitive element is not limited. The photosensitive element may include the actinic radiation opaque layer disposed above and covers or substantially covers the entire surface of the photopolymerizable layer. In this case the infrared laser radiation imagewise removes, i.e., ablates or vaporizes, the radiation opaque layer and forms an in-situ mask as disclosed by Fan in U.S. Pat. No. 5,262,275; Fan in U.S. Pat. No. 5,719,009; Fan in EP 0 741 330 A1; and Van Zoeren in U.S. Pat. Nos. 5,506,086 and 5,705,310. A material capture sheet adjacent the radiation opaque layer may be present during laser exposure to capture the material as it is removed from the photosensitive element as disclosed by Van Zoeren in U.S. Pat. No. 5,705,310. Only the portions of the radiation opaque layer that were not removed from the photosensitive element will remain on the element forming the in-situ mask.

In another digital method of mask formation, the photosensitive element will not initially include the actinic radiation opaque layer. A separate element bearing the radiation opaque layer will form an assemblage with the photosensitive element such that the radiation opaque layer is adjacent the surface of the photosensitive element opposite the support, which is typically is the photopolymerizable layer. (If present, a coversheet associated with the photosensitive element typically is removed prior to forming the assemblage.) The separate element may include one or more other layers, such as ejection layers or heating layers, to aid in the digital exposure process. Hereto, the radiation opaque layer is also sensitive to infrared radiation. The assemblage is exposed imagewise with infrared laser radiation to selectively transfer or selectively alter the adhesion balance of the radiation opaque layer and form the image on or disposed above the photopolymerizable layer as disclosed by Fan et al. in U.S. Pat. No. 5,607,814; and Blanchett in U.S. Pat. Nos. 5,766, 819; 5,840,463; and EP 0 891 877 A. As a result of the imagewise transfer process, only the transferred portions of the radiation opaque layer will reside on the photosensitive element forming the in-situ mask.

In-situ mask formation by infrared laser exposure can be carried out using various types of infrared lasers, which emit in the range 750 to 20,000 nm. Infrared lasers including diode lasers emitting in the range 780 to 2,000 nm and Nd:YAG lasers emitting at 1064 nm are preferred. A preferred apparatus and method for infrared laser exposure to imagewise remove the actinic radiation opaque layer from the photosensitive element is disclosed by Fan et al. in U.S. Pat. Nos. 5,760,880 and 5,654,125. The in situ mask images remain on the photosensitive element for subsequent steps of overall exposure to actinic radiation and treating.

It is also contemplated that digital mask formation can be accomplished by imagewise application of the radiation opaque material in the form of inkjet inks. Imagewise application of an ink-jet ink can be directly on the photopolymerizable layer or disposed above the photopolymerizable layer on another layer of the photosensitive element. Another contemplated method that digital mask formation can be accomplished is by creating the mask image of the radiation opaque layer on a separate carrier and then transferring with application of heat and/or pressure to the surface of the photopolymerizable layer opposite the support. The photopolymerizable layer is typically tacky and will retain the transferred image. The separate carrier can then be removed from the element prior to imagewise exposure. The separate carrier may have a radiation opaque layer that is imagewise exposed to laser radiation to selectively remove the radiation opaque material and form the image.

It is also possible to use more than one additional layers or types of layer. For example, an elastomeric capping layer may be present next to the photopolymerizable layer and this, in turn, may be overcoated with a release layer. The exact choice of additional layer(s) will depend on the nature of the photopolymerizable layer, whether or not the actinic radiation opaque layer is present, the nature of the radiation opaque layer and other physical requirements of the photosensitive element.

The photosensitive printing element of the present invention may further include a temporary coversheet on top of the uppermost layer of the element. One purpose of the coversheet is to protect the uppermost layer of the photosensitive printing element during storage and handling. Examples of suitable materials for the coversheet include thin films of polystyrene, polyethylene, polypropylene, polycarbonate, fluoropolymers, polyamide or polyesters, which can be subbed with release layers. The coversheet is preferably prepared from polyester, such as Mylar® polyethylene terephthalate film; most preferably the coversheet is 5-mil Mylar®.

If any one exposure will be based on energy density (instead of time), the step exposure test for the exposure should be conducted using a sample having the same or substantially the same composition and structure as the second photosensitive element; and, the exposure should be conducted under the same or substantially the same conditions as desired to expose the second photosensitive element.

Overall exposure of the photosensitive element to the actinic radiation is through a mask, which can be a phototool or an in-situ mask. The mask includes opaque areas and "clear" areas that form the image. The opaque areas of the mask prevent the photopolymerizable material beneath from being exposed to the radiation and hence those areas of the photopolymerizable layer covered by the dark areas do not polymerize. The "clear" areas of the mask expose the photopolymerizable layer to actinic radiation and polymerize or crosslink. The image necessary for the imagewise exposure of the photopolymerizable layer can be generated by any method including conventional and digital methods, including inkjet application an in-situ mask image may need to be formed on or disposed above the surface of the photopolymerizable layer opposite the support.

Imagewise exposure of the photosensitive element is exposure to actinic radiation through a mask. The photosensitive element is exposed through the mask to actinic radiation from suitable sources as described above. If the digital mask was formed in-situ on the photosensitive element, the element is overall exposed through the in-situ mask image. A conventional method for imagewise exposure is by using an image-bearing transparency film or phototool, typically a silver halide film, as the mask. Typically, the phototool includes the image on a polyester base that is 5 to 7 mils thick. The image-bearing transparency film is placed on the release layer, a vacuum is pulled to assure good contact of the mask film to the element, and the element is exposed. The image-bearing transparency film is removed from the element prior to treating. Imagewise exposure can be based on time, but in one embodiment is based on the energy density sufficient to crosslink the exposed areas down to the support or to the back exposed layer, i.e., floor, as described above.

Imagewise exposure of the photosensitive element to actinic radiation may be conducted in the presence or absence of atmospheric oxygen for photosensitive elements having an in situ mask. Atmospheric oxygen is eliminated when the exposure is conducted in a vacuum. The exposure may be conducted in a vacuum to minimize the effects of oxygen on the polymerization reactions occurring in that layer. For photosensitive elements having an in-situ mask, the exposure can be in the presence of atmospheric oxygen. For photosensitive elements that are exposed through an image transparency, the exposure must be conducted in vacuum to assure good contact between the image transparency and the photosensitive element.

The photosensitive printing element is treated to remove unpolymerized areas in the photopolymerizable layer and thereby form a relief image. The treating step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer. For photosensitive elements in which the mask was formed digitally, the treating step also removes the mask image (which had been exposed to actinic radiation) and the underlying unexposed areas of the photopolymerizable layer.

Treatment of the photosensitive printing element includes (1) "wet" development wherein the photopolymerizable layer is contacted with a suitable developer solution to washout unpolymerized areas and (2) "dry" development wherein the photosensitive element is heated to a development temperature which causes the unpolymerized areas of the photopolymerizable layer to melt or soften or flow and is removed by contact with an absorbent material. Dry development may also be called thermal development.

Wet development is usually carried out at about room temperature. The developers can be organic solvents, aqueous or semi-aqueous solutions, and water. The choice of the developer will depend primarily on the chemical nature of the photopolymerizable material to be removed. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796,602.

Development time can vary, but it is preferably in the range of about 2 to about 25 minutes. Developer can be applied in any convenient manner, including immersion, spraying and brush or roller application. Brushing aids can be used to remove the unpolymerized portions of the element. Washout can be carried out in an automatic processing unit which uses developer and mechanical brushing action to remove the unexposed portions of the plate, leaving a relief constituting the exposed image and the floor.

Following treatment by developing in solution, the relief printing plates are generally blotted or wiped dry, and then more fully dried in a forced air or infrared oven. Drying times and temperatures may vary however typically the plate is dried for 60 to 120 minutes at 60° C. High temperatures are not recommended because the support can shrink and this can cause registration problems.

Treating the element thermally includes heating the photosensitive element having at least one photopolymerizable layer (and the additional layer/s) to a temperature sufficient to cause the uncured portions of the photopolymerizable layer to soften or melt or flow, and contacting an outermost surface of the element to an absorbent surface to absorb or wick away the melt or flow portions. The polymerized areas of the photopolymerizable layer have a higher melting temperature than the unpolymerized areas and therefore do not melt, soften, or flow at the thermal development temperatures. Thermal development of photosensitive elements to form flexographic printing plates is described by Martens in U.S. Pat. Nos. 5,015,556; 5,175,072; 5,215,859; and by Wang et al. in WO 98/13730.

The term "melt" is used to describe the behavior of the unirradiated portions of the photopolymerizable elastomeric layer subjected to an elevated temperature that softens and reduces the viscosity to permit flow and absorption by the absorbent material. The material of the meltable portion of the photopolymerizable layer is usually a viscoelastic material which does not have a sharp transition between a solid and a liquid, so the process functions to absorb the heated composition layer at any temperature above some threshold for absorption in the absorbent material. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with an absorbent material can be done at the same time, or in sequence provided that the uncured portions of the photopolymerizable layer are still soft or in a melt state when contacted with the absorbent material. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the absorbent material. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the absorbent material with the photopolymerizable layer that is molten in the uncured regions, a transfer of the uncured photosensitive material from the photopolymerizable layer to the absorbent material takes place. While still in the heated condition, the absorbent material is separated from the cured photopolymerizable layer in contact with the support layer to reveal the relief structure. A cycle of the steps of heating the photopolymerizable layer and contacting the molten (portions) layer with an absorbent material can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the absorbent material to the photopolymerizable layer (while in the uncured portions are melt) may be maintained by the pressing the layer and the absorbent material together.

A preferred apparatus to thermally develop the photosensitive element is disclosed by Peterson et al. in U.S. Pat. No. 5,279,697, and also by Johnson et al. in U.S. Pat. No. 6,797,454. The photosensitive element may be placed on a drum or a planar surface in order for thermal treatment to be carried out.

The absorbent material is selected having a melt temperature exceeding the melt temperature of the uncured portions of the photopolymerizable layer and having good tear resistance at the same operating temperatures. Preferably, the selected material withstands the temperatures required to process the photosensitive element during heating. The absorbent material is selected from non-woven materials, paper stocks, fibrous woven material, open-celled foam materials, porous materials that contain more or less a substantial fraction of their included volume as void volume. The absorbent material can be in web or sheet form. The absorbent materials should also possess a high absorbency for the molten elastomeric composition as measured by the grams of elastomer that can be absorbed per square millimeter of the absorbent material. Preferred is a non-woven nylon web.

It is also contemplated that the photosensitive element may undergo one or more treating steps to sufficiently remove the uncured portions to form the relief. The photosensitive element may undergo both wet development and dry development, in any order, to form the relief. A pre-development treating step may be necessary to remove one or more of the additional layers disposed above the photopolymerizable layer if such additional layers are not removable by the washout solution and/or by heating.

The process of preparing a printing form from a photosensitive element usually includes a back exposure or backflash step, which is used to create a layer of polymerized material, or a floor, on the support side of the photopolymerizable layer and to sensitize the photopolymerizable layer. Any of the actinic radiation sources discussed above can be used for the backflash exposure step. Backflash exposure can be based on time, but in one embodiment is based on energy density as described above.

The photosensitive printing elements of the present invention can be uniformly post-exposed to ensure that the photopolymerization process is complete and that the element will remain stable during printing and storage. This post-exposure step can utilize the same radiation source as the overall exposure. The post-exposure step can be based on time, but in one embodiment is based on energy density as described above.

Detackification is an optional post-development treatment that can be applied if the surface of the photosensitive printing element is still tacky, such tackiness not generally being removed in post-exposure. Tackiness can be eliminated by methods well known in the art, such as treatment with bromine or chlorine solutions. Preferably, detackification is accomplished by exposure to radiation sources having a wavelength not longer than 300 nm, as disclosed in European Published Patent Application 0 017927 and Gibson U.S. Pat. No. 4,806,506. The detackification exposure step can be based on time, but in one embodiment is based on energy density as described above.

What is claimed is:

1. A method for making a printing form having a desired cure response, Rc, comprising:
    a) providing a photosensitive element having a layer of a photopolymerizable composition comprising an elastomeric binder, a monomer, and a photoinitiator capable of activation by actinic radiation;
    b) providing a source of the actinic radiation having an emission spectra and a peak emission;
    c) measuring intensity of the source using a sensor having an absorption peak matched to the peak emission of the source of actinic radiation;
    d) conducting a step exposure test comprising:
        1) exposing the photosensitive element to the source of actinic radiation at times T1 and T2;
        2) treating to form polymerized portions having a cure response Rc1 and Rc2 corresponding to times T1 and T2 respectively; and
        3) measuring the cure responses Rc1 and Rc2;
    e) creating a polymerization rate curve for the photosensitive element of the cure response versus energy density that is determined by the intensity of step c) multiplied by the times T1 and T2;
    f) providing a second photosensitive element having a layer of the composition comprising the elastomeric binder, the monomer, and the photoinitiator; and
    g) exposing the second element to the source of the actinic radiation based on an energy density determined from the polymerization rate curve generated in step e) to form polymerized portions having the desired cure response Rc.

2. The method of claim 1 further comprising the step of treating the second element to remove unpolymerized portions.

3. The method of claim 2 wherein the treating step is selected from the group consisting of:
    (1) processing the exposed second element of with at least one washout solution selected from the group consisting of solvent solution, aqueous solution, semi-aqueous solution, and water; and
    (2) heating the exposed second element to a temperature sufficient to cause areas to melt, flow, or soften.

4. The method of claim 1 wherein the printing element further comprises a support transparent to actinic radiation adjacent the layer of photopolymerizable composition, and the exposure steps d) and g) are through the support side of the element.

5. The method of claim 1 further comprising having a mask adjacent the layer of photopolymerizable composition, and the exposure steps d) and g) are through the mask of the element.

6. The method of claim 1 further comprising warming the source of actinic radiation before the measuring step c).

7. The method of claim 1 wherein the cure response is selected from the group consisting of thickness of a floor of the polymerized portions, and one or more relief image characteristics.

8. The method of claim 1 wherein the absorption peak of the sensor is at a wavelength of 370 nm.

9. The method of claim 8 wherein the source of actinic radiation has a peak emission wavelength within 25 nm wavelengths of the absorption peak of the sensor.

10. The method of claim 1 wherein the source of actinic radiation has a peak emission wavelength at about 370 nm.

11. The method of claim 1 wherein the source of actinic radiation has a peak emission wavelength at about 365 nm.

12. The method of claim 1 wherein the source of actinic radiation has a peak emission wavelength at about 360 nm.

13. The method of claim 1 wherein the source of actinic radiation has a peak emission wavelength at about 355 nm.

14. The method of claim 1 wherein the source of actinic radiation has a peak emission wavelength at about 255 nm.

15. The method of claim 1 wherein the source of actinic radiation is selected from the group consisting of carbon arcs, mercury-vapor arcs, argon-glow lamps, fluorescent lamps and tubes, pulsed xenon lamps, electron flash units, electron beam units, and photographic flood lamps.

16. The method of claim 1 wherein the source of the actinic radiation has an emission spectrum overlapping with the absorption spectrum of the photoinitiator.

* * * * *